US009520515B2

(12) United States Patent
Kuznicki et al.

(10) Patent No.: US 9,520,515 B2
(45) Date of Patent: Dec. 13, 2016

(54) EMITTER STRUCTURE BASED ON SILICON COMPONENTS TO BE USED IN A PHOTOVOLTAIC CONVERTER AND A METHOD FOR PRODUCTION OF THE PHOTOVOLTAIC DEVICE

(75) Inventors: Zbigniew Kuznicki, Hoenheim (FR); Patrick Meyrueis, Strasbourg (FR)

(73) Assignee: SEGTON ADT SAS, Versailles (FR)

( * ) Notice: Subject to any disclaimer, the term of this patent is extended or adjusted under 35 U.S.C. 154(b) by 283 days.

(21) Appl. No.: 14/003,476

(22) PCT Filed: Mar. 22, 2012

(86) PCT No.: PCT/IB2012/000867
§ 371 (c)(1),
(2), (4) Date: Sep. 6, 2013

(87) PCT Pub. No.: WO2012/131496
PCT Pub. Date: Oct. 4, 2012

(65) Prior Publication Data
US 2013/0340819 A1    Dec. 26, 2013

Related U.S. Application Data

(60) Provisional application No. 61/457,428, filed on Mar. 25, 2011.

(51) Int. Cl.
*H01L 21/00*    (2006.01)
*H01L 31/00*    (2006.01)
(Continued)

(52) U.S. Cl.
CPC ....... *H01L 31/035254* (2013.01); *B82Y 20/00* (2013.01); *H01L 31/028* (2013.01); *H01L 31/02363* (2013.01); *H01L 31/036* (2013.01); *H01L 31/0376* (2013.01); *H01L 31/03529* (2013.01); *H01L 31/03762* (2013.01);
(Continued)

(58) Field of Classification Search
CPC ............ H01L 31/0352; H01L 31/035254; H01L 31/036; H01L 31/0376; H01L 31/068; H01L 31/035245; H01L 31/03762; H01L 31/03845; H01L 31/1804; H01L 31/186; H01L 31/1864; H01L 31/202; H01L 31/208; Y02E 10/50; Y02E 10/545; Y02E 10/546; Y02E 10/547; Y02E 10/548; B82Y 20/00; B82Y 40/00
(Continued)

(56) References Cited

U.S. PATENT DOCUMENTS 5,935,345 A    8/1999    Kuznicki
2005/0252544 A1*    11/2005    Rohatgi .............. H01L 31/0288
136/262

FOREIGN PATENT DOCUMENTS

WO    WO 2010/089624    8/2010

OTHER PUBLICATIONS

Kuznicki et al. "Multistage PV conversion using a metamaterial based on the nanostructured Si". 2008. Photonic Systems Laboratory.*

* cited by examiner

*Primary Examiner* — Lindsey Bernier
(74) *Attorney, Agent, or Firm* — Law Offices of Steven W. Weinrieb

(57) ABSTRACT

This invention aims to reduce and preferably to cancel the carrier collection limit effect in order to considerably increase the conversion efficiency. This improvement is achieved by a suitable modification of the amorphized layer
(Continued)

thickness or even by discontinuities separating amorphizing beams or amorphized nanopellets.

30 Claims, 6 Drawing Sheets

(51) Int. Cl.
*H01L 31/0352* (2006.01)
*H01L 31/036* (2006.01)
*H01L 31/0376* (2006.01)
*H01L 31/0384* (2006.01)
*H01L 31/18* (2006.01)
*H01L 31/20* (2006.01)
*H01L 31/028* (2006.01)
*H01L 31/0236* (2006.01)
*B82Y 20/00* (2011.01)
*B82Y 40/00* (2011.01)

(52) U.S. Cl.
CPC ............ *H01L 31/03845* (2013.01); *H01L 31/035245* (2013.01); *H01L 31/035281* (2013.01); *H01L 31/1804* (2013.01); *H01L 31/1864* (2013.01); *H01L 31/202* (2013.01); *H01L 31/208* (2013.01); *B82Y 40/00* (2013.01); *Y02E 10/50* (2013.01); *Y02E 10/545* (2013.01); *Y02E 10/546* (2013.01); *Y02E 10/547* (2013.01); *Y02E 10/548* (2013.01); *Y02P 70/521* (2015.11)

(58) Field of Classification Search
USPC ....... 136/252, 255, 258, 261; 438/57, 63, 96
See application file for complete search history.

Lower ion beam current

Focus

Higher ion beam current

EMITTER STRUCTURE BASED ON SILICON COMPONENTS TO BE USED IN A PHOTOVOLTAIC CONVERTER AND A METHOD FOR PRODUCTION OF THE PHOTOVOLTAIC DEVICE

FIELD OF THE INVENTION

This invention relates to an improved emitter structure of multi-interface novel devices for a light-to-electricity conversion in a photovoltaic converter to produce electricity from light particularly from solar radiation and a method for its production.

BACKGROUND OF THE INVENTION

This invention derives from the schematic structure of the previously disclosed photovoltaic emitter according to WO 2010/089624 in the name of the same inventors Zbigniew T. KUZNICKI and Patrick MEYRUEIS, which is incorporated herein by way of reference.

This previous photovoltaic device is able to exploit high energy photons, in particular UV and visible photons, in addition to near IR photons, said device comprising a slab, wafer or chip of p-type or n-type photovoltaic material produced according to the method claims of WO 2010/089624, having a top surface intended to be exposed to photonic radiation, having a built-in P-N junction delimiting an emitter part and a base part, having front and rear carrier collection and extraction means and comprising at least one area or region specifically designed or adapted to absorb high energy or energetic photons and located adjacent or near at least one hetero-interface. This device is characterised in that said slab, wafer or chip of photovoltaic material comprises also at least one metamaterial field or region forming a low-energy secondary carrier generation cavity, which is contiguous or proximate to the at least one absorption area or region for the energetic photons and subjected to a built-in or applied electrical field having an intensity sufficient to withdraw and move away the secondary electrons libe-rated by the primary hot electrons from their initial sites within the concerned metamaterial area or region, at a speed sufficient to prevent their return into said metamaterial region or field, thus forming a substructure performing multistage conversion, wherein the density of divacancies within the metametallic field(s) or region(s) is greater than $10^{18}$ divacancies/$cm^3$, preferably greater than $10^{19}$ diva-cancies/$cm^3$, most preferably greater than $10^{20}$ divacancies/$cm^3$ and the conduction between the metamaterial and the respectively adjacent n-type material has a time constant which is at the most of the same magnitude that the secondary carrier generation time constant, wherein the thickness of the or each planar amorphous semiconductor material layer is comprised between 10 nm and 50 nm and wherein the width of the respectively associated metamaterial field(s) or re-gion(s), in the shape of (a) continuous or discontinuous layer(s), is less than 10 nm, the semiconductor material having preferably a thickness comprised with-in 5 µm and 500 µm, preferably between 10 µm and 280 µm.

This previous invention is also characterised by a carrier collection limit designated here as CCL which is the limit separating the emitter in two parts: the upper emitter which is an electronically dead zone, and the lower emitter which is electronically fully active. As shown on FIG. 1, the converter is composed of a surface layer connected to a front grid electrode and a base connected to a rear electrode and between them an emitter structure divided in an upper emitter and a lower emitter. The thicknesses of the upper and lower emitters are respectively designated as <<du>> and <<dl>> (FIG. 1). These upper and lower emitters are separated by the limit zone called CCL for the Carrier Collection Limit. This photovoltaic emitter structure is readily visible on FIG. 1 on which the CCL limit is shown by a solid black line.

The CCL can be defined as the interface with its potential barrier blocking generated carriers to move towards the PN collection junction. So the carriers of opposite signs generated within the upper emitter cannot be collected because it is not possible for them to be separated one each from the other with regard to the CCL.

The goal of this present invention is multiple.

The first one is to proceed with the collection of the whole photo-generated population of free carriers from all components of the light-to-electricity converter i.e. particularly from the upper emitter located between the front face and the nanoscale silicon layered system.

The second one is to reduce and preferably to cancel the CCL effect in order to considerably increase the conversion efficiency.

The last one is to improve further the conversion efficiency by suitable modifications of the amorphized silicon layer.

This enhancement is obtained through this present invention by means of at least a double transformation which results of an amorphization beam that scans the silicon wafer. The suitable scanning process leads to discontinous or locally thinned and very thin amorphized layer. The process can be performed by an ion beam implantation process or an electron beam irradiation process. The ions can be for example, silicon or phosphorous ions.

The CCL effect is suppressed by a suitable structure discontinuity or by, for example, the tunnel conduction across locally thinned CCL.

In such a case, the structure conveys carriers through limited special thin zones the carriers that have to reach the collection PN junction. They can pass through the crystalline passages of the buried substructure or through the very thin zones where the thickness of the buried structure is so reduced that the tunnel conduction effect can appear. All these passages have to be not too much spaced with respect of the carrier movements along the buried substructure, i.e. movements perpendicular to the collecting PN junction.

These and other benefits of this invention will become clear from the following description by reference to the drawings.

BRIEF DESCRIPTION OF THE DRAWINGS

FIG. 2 is a schematic cross-sectional view of an amorphized silicon layer wherein the a-Si shape is that of an undulation;

FIG. 3 is a schematic cross-sectional view of an amorphized silicon layer wherein the a-Si shape is that of a trapeziform;

FIG. 4 is a schematic cross-sectional view of an amorphized silicon layer similar to that of FIG. 2 but with discontinuities;

FIG. 5 is a schematic cross-sectional view of an amorphized silicon layer similar to that of FIG. 3 but with discontinuities;

FIG. 6 is a schematic cross-sectional view of an amorphized silicon layer with three buried nanoscale Si-layered systems, i.e. three amorphized a-Si layers buried at different depths;

FIG. 7 is a schematic cross-sectional view of an amorphized silicon layer which is substantially the same as that of FIG. 6 but with the second layer shifted with respect to the first and third layers;

DETAILED DESCRIPTION OF THE ILLUSTRATED EMBODIMENTS

The silicone wafer is first treated according partially to the method disclosed within WO 210/089624 which is incorporated herein by way of reference.

1. Insertion of the Amorphized Silicon Layer within the Single Crystal Wafer.

This process is performed either by way of an ion beam implantation or by way of an electron beam irradiation. The ions are, for example, preferably silicon ions or phosphorous ions.

The general purpose is to create a relief which consists of a succession of concavities or protrusions and hollows or discontinuities as shown on FIGS. 2 to 7 in or with the amorphized silicon layer a-Si. These forms are separated from the silicon crystalline mass c-Si by a nanolayer of nanometamaterial MTM which is a metamaterial derived from crystalline silicone c-Si by way of an ion beam implantation or an electron beam irradiation or some equivalent process. This metamaterial MTM of this nanolayer is designated by the label <c-Si>. It is inserted on the single-crystal silicon side of the hetero-interface between amorphized/crystalline (a-Si/c-Si) silicon. The labels a-Si and c-Si are the same as defined in the figures of the drawings.

During one of these processes it occurs insertion by penetration of the ions or electrons within the structure and interaction with it and finally stabilisation at a certain depth.

This insertion process by means of implantation or irradiation occurs after having built-in the PN junction structure which results of a particular P doping diffusion or by epitaxy. So the PN junction is already built-in and the P doping profile is a heavily doped profile and simultaneously the N part of this PN junction has to be heavily doped and then the scanning process may occur.

This insertion may be achieved by scanning the structure with an ion beam or with an electron beam in order to proceed with an ion implantation or electron irradiation process with more or less energy and dose i.e more or less ion current or electron velocity.

We use scan steps with an ion implantation beam or irradiation by an electron beam. As shown on the figures, we can proceed for a low ion beam current with multiple close passages or for a high ion beam current with one passage at a time necessary for locally controlled amorphization as illustrated by the relevant FIGS. 11 and 12.

Figure 11:
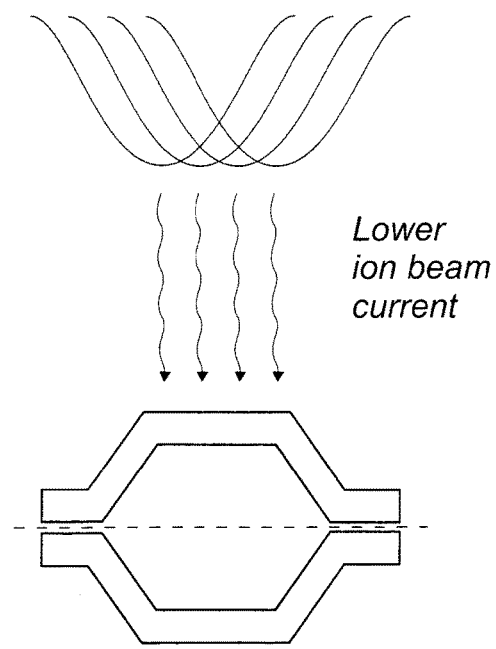
FIG. 11 discloses the use of a pattern comprising several close passages and the use of a relatively low ion beam current.
Figure 12:
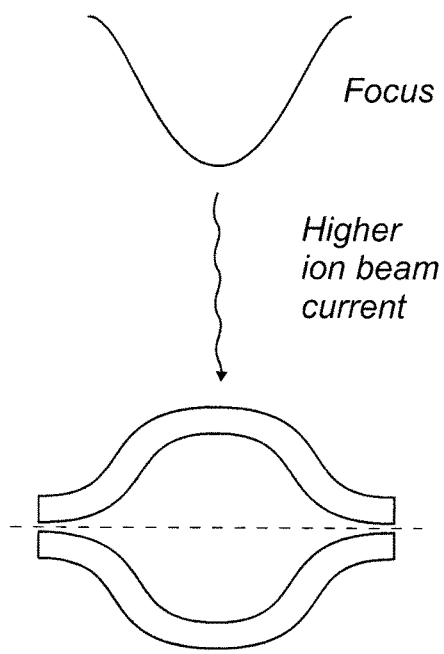
FIG. 12 discloses the use of a pattern comprising one single passage and the use of a relatively high ion beam current.

We can use either several close passages with low energy dose beams as shown on the FIG. 11 or one single passage with a high energy dose beam (FIG. 12).

Figure 8:
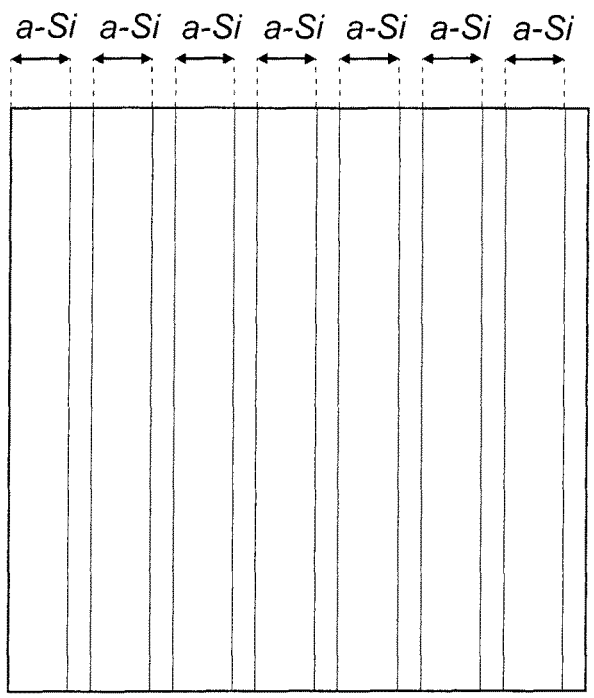
FIGS. 8-10 are schematic plans view of a wafer which shows three different patterns of ion or electron beam scanning comprising the use of length-wise passages, crossed passages, and oblique passages.
Figure 9:
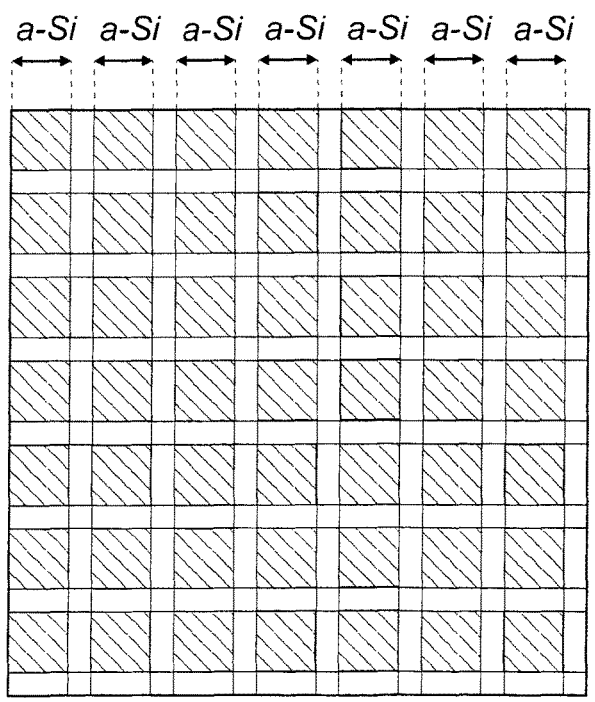
Figure 10:
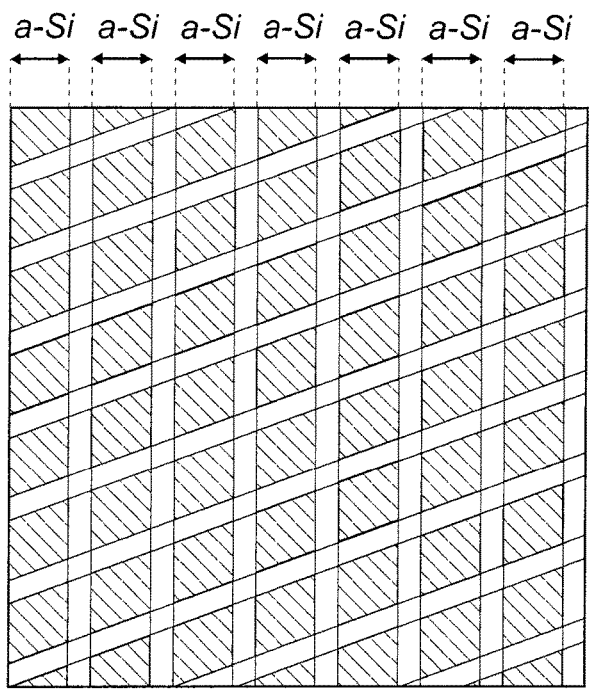

The scanning may proceed with one or several passages and then shift the beams in order to create discontinuities between the concavities or protrusions i.e the strips a-Si (FIGS. 8 to 10).

The scanning with the electron beam is rather the same in order to obtain the scanning patterns as shown in the related figures.

An alternative manner is to first scan along one direction of the wafer and then along another direction of the wafer perpendicular to the first one as shown in FIG. 9.

It is also possible to first scan in a straight manner and then in an oblique manner as shown in FIG. 10.

The strips designated by a-Si between the lines shown on these FIGS. 8 to 10 define the width of the passage or passages of the beam in order to form the protrusions of a-Si material with the limits created by the ion implantation or electron irradiation work which is the metamaterial MTM derived from crystal silicone and labelled <c-Si>.

The ion implantation energy ranges from 10 to 300 keV and the dose of ions is comprised between $5\times10^{14}$ cm$^{-2}$ and $5\times10^{16}$ cm$^{-2}$ with a heavily doped profile.

The electron irradiation energy i.e. the acceleration potential ranges from 200 keV to 5 MeV.

The ion beam current or the depositing energy depends on the ion profile. At least one passage is required if the implanted charge is sufficient to obtain amorphization. But several paths are needed to locally accumulate the depositing energy if the single charge is not sufficient to obtain amorphization of the silicon which is in the crystal state.

If the doping profile is previously brought to emitter then silicon ions can be used to operated a buried amorphization in silicon structure by the self-implantation of silicon.

The tip of the beam must be properly shaped as well as the focus settings in order to ensure a proper result.

Figure 1:
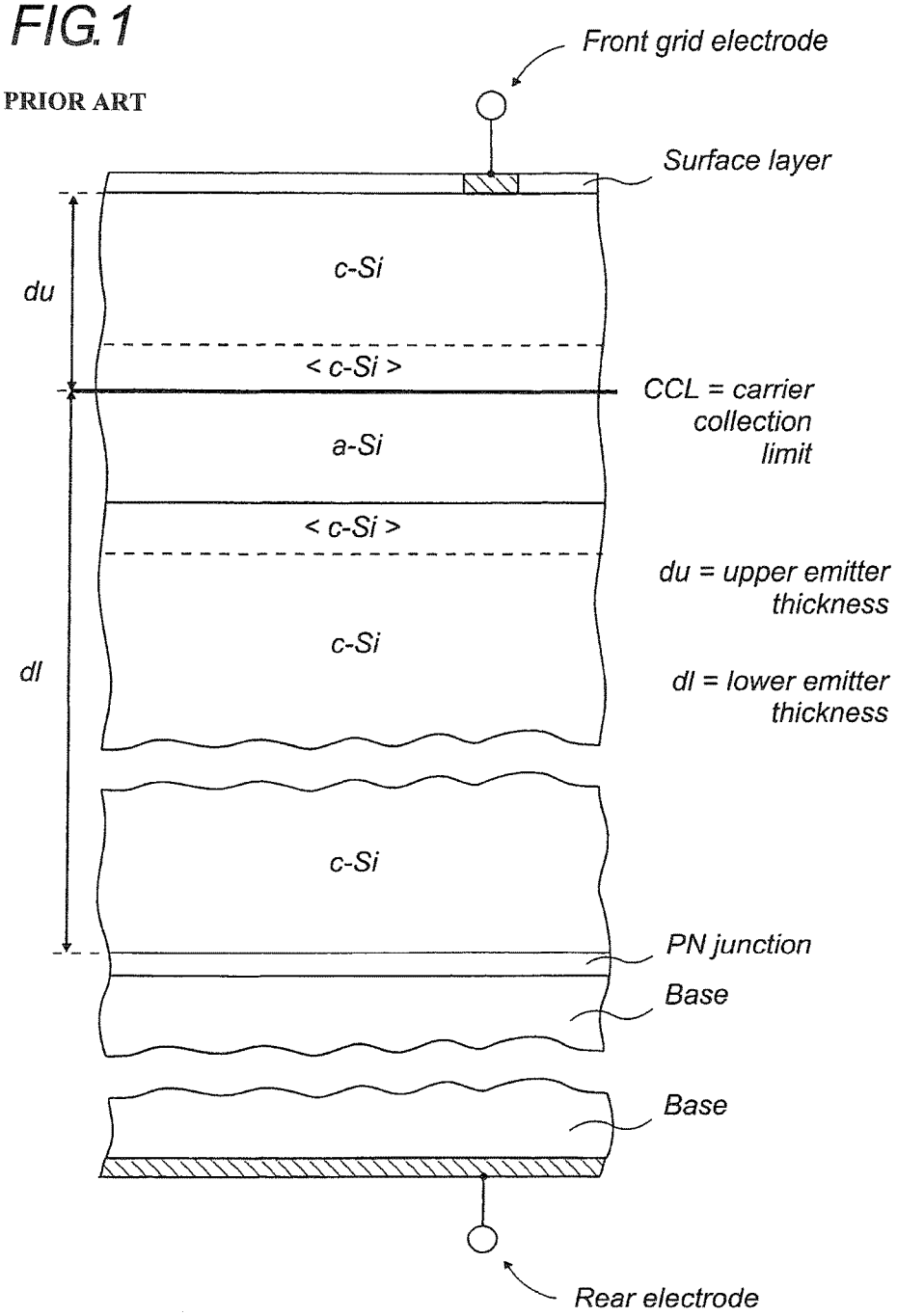
FIG. 1 is a schematic transverse sectional view of a photovoltaic emitter according to WO 2010/089624 where the CCL zone is shown by means of a large solid black line.
Figure 2:
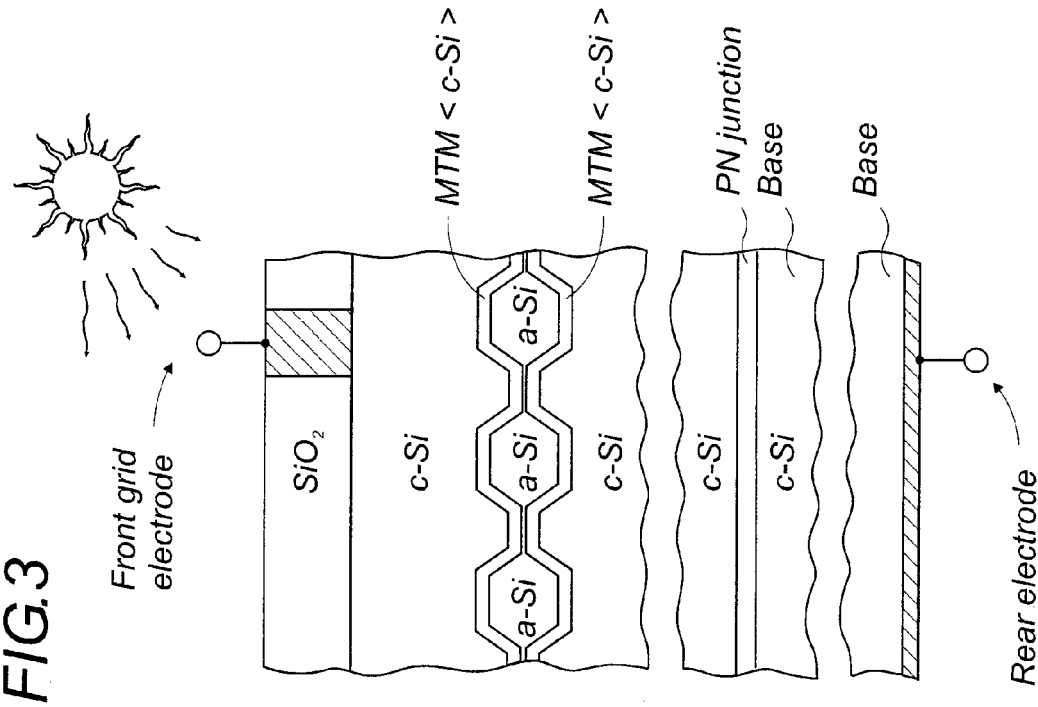
FIGS. 2 to 7 are schematic cross-sectional views of an improved photovoltaic emitter where the CCL is suppressed, wherein, more particularly.
Figure 3:
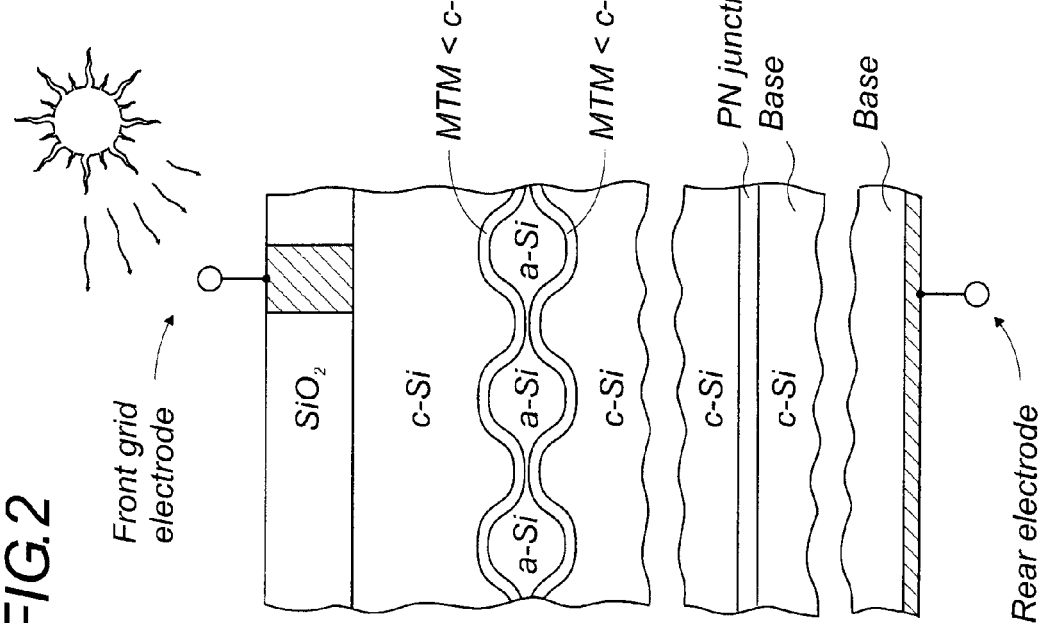
Figure 4:
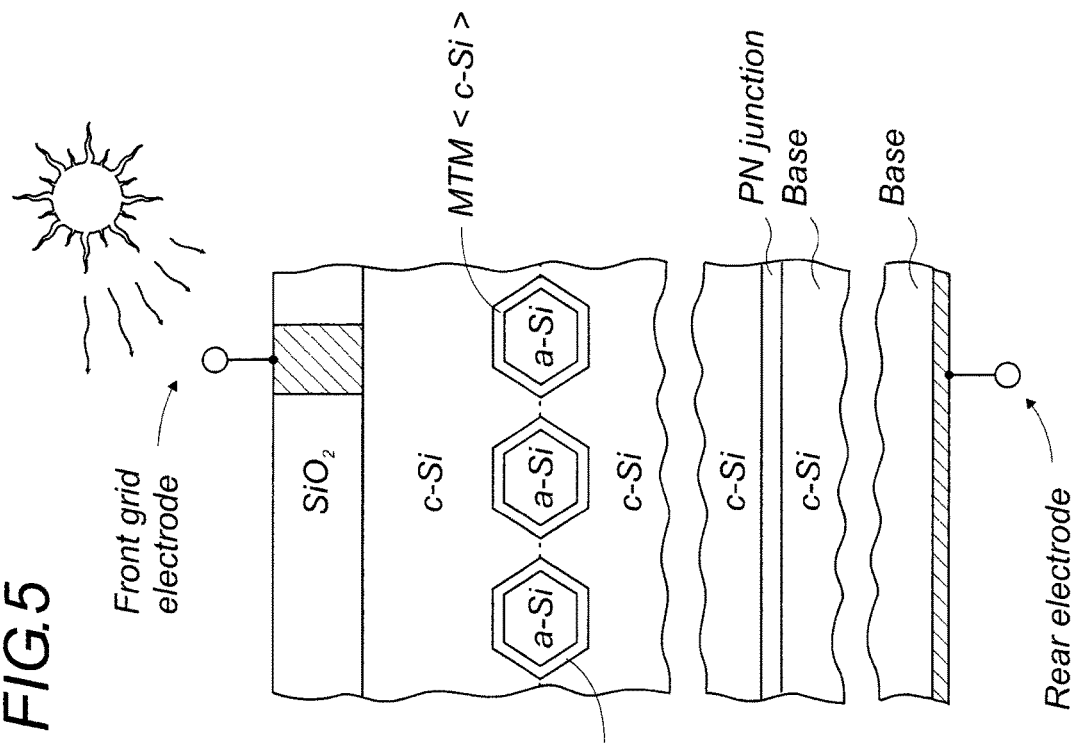
Figure 5:
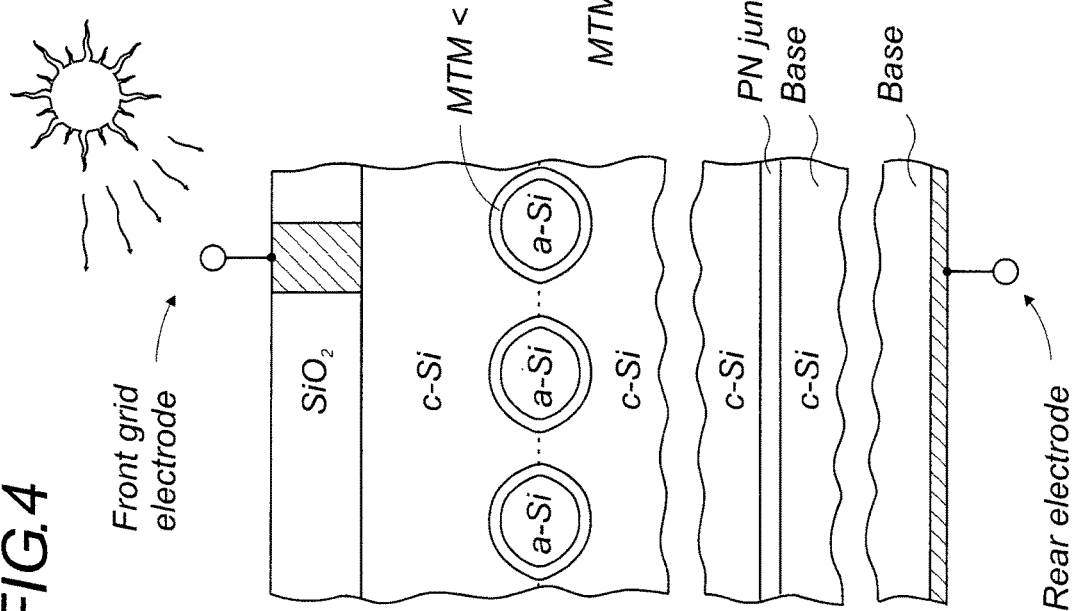
Figure 6:
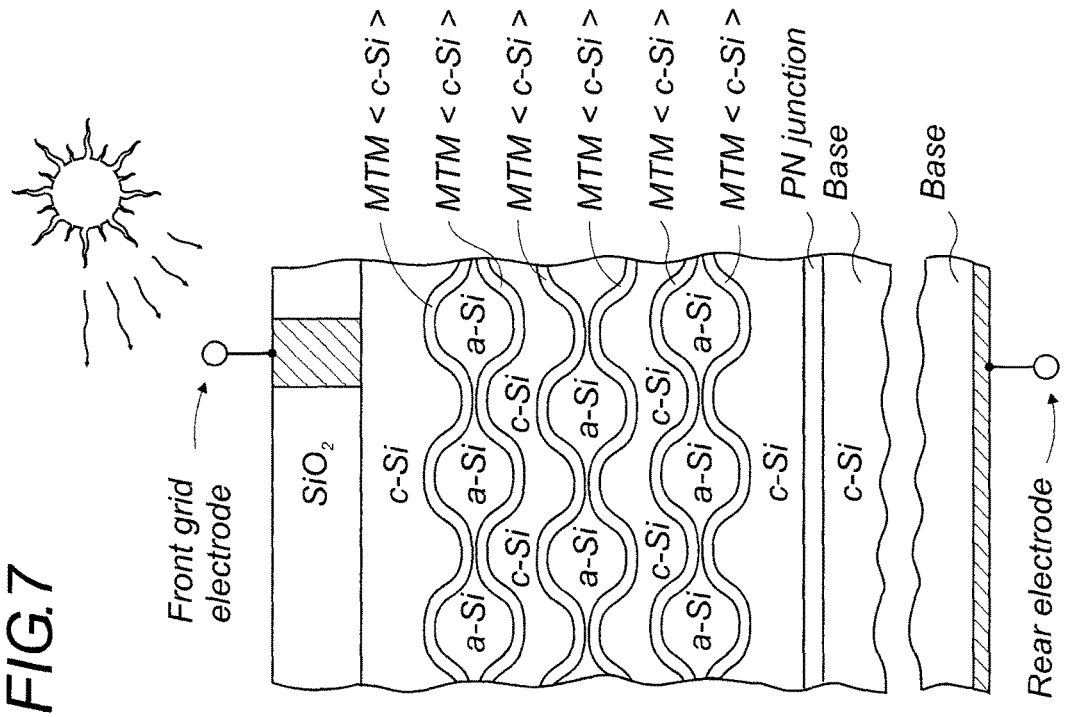
Figure 7:
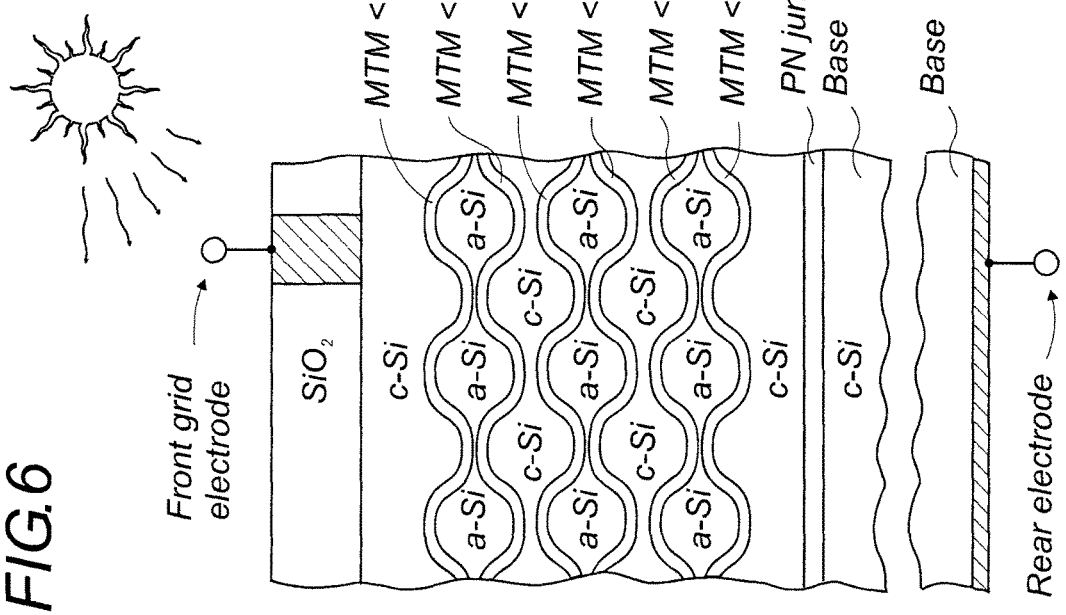

The forms as shown on the FIGS. 2, 3 and 4, that is, the succession of concavities or platforms and hollows, demonstrates the creation of pass-ages between them through which the carriers will pass by a tunnel effect.

As implanted, the amorphized layer a-Si has mismatched interface zones with the surrounding silicone crystals. As this mismatched interface is of no practical interest, a thermal treatment is necessary in order to render this device usable.

2. Thermal Treatment

Then follows the thermal treatment which will render the limits properly thin and clear and which consists of several thermal cycles.

In order to obtain an abrupt c-Si/a-Si interface, a suitable thermal treatment is applied.

For example, the thermal treatment consists in one initial continuous annealing step, followed by at least one cycle of successive discontinuous annealing sequences.

The annealing rate is to be limited to avoid structural defects. The low temperature is selected for stabilizing the solid state epitaxy for example approximately 100° C. while the high temperature is approximately 500° C. Each exposure to high temperature lasts for example from 2 to 5 minutes with a recuperation time of for example 1 to 4 minutes which may be reduced by means of appropriate gradients of temperature. For example, three to six cycles are necessary.

After the thermal treatment is completed, the c-Si/a-Si limits between the material phases are clean, clear and accurate.

The above described emitter is to be used in light-to-electricity converter which must be completed by front and rear electrodes as well as by different conventional components and by an appropriate optic block or platform to concentrate the solar radiation onto the wafer.

The light-to-electricity converter so produced results in a high conversion efficiency so that the total active surface does not have to be large, and therefore an appropriate concentration optic is required.

The invention claimed is:

1. A photovoltaic device, comprising:
   a crystalline silicon base member;
   a rear electrode operatively connected to said crystalline silicon base member;
   a crystalline silicon emitter member formed from a crystalline silicon mass and having a front face;
   a front grid electrode operatively connected to said front face of said crystalline silicon emitter member;
   a PN junction between said crystalline silicon base member and said crystalline silicon emitter member;
   at least one continuous layer of amorphized silicon material comprising a plurality of substantially separate amorphized silicon regions and disposed within said crystalline silicon mass of said crystalline silicon emitter member; and
   at least one pair of nanolayers of crystalline silicon metamaterial, wherein each one of said at least one pair of nanolayers of crystalline silicon metamaterial has an undulating configuration comprising a plurality of trough and crest portions wherein said plurality of trough portions of a first nanolayer of said at least one pair of nanolayers are respectively disposed opposite said plurality of crest portions of a second nanolayer of said at least one pair of nanolayers such that said plurality of trough portions and said plurality of crest portions of said at least one pair of nanolayers substantially surround said plurality of substantially separate amorphized silicon regions so as to separate said at least one layer of amorphized silicon material from said crystalline silicon mass.

2. The photovoltaic device as set forth in claim 1, wherein:
   said first nanolayer of crystalline silicon metamaterial is interposed between said crystalline silicon emitter member and said plurality of substantially separate amorphized silicon regions so as to form a first nanolayer of crystalline silicon metamaterial interface; and
   said second nanolayer of crystalline silicon metamaterial is interposed between said crystalline silicon emitter member and said plurality of substantially separate amorphized silicon regions so as to form a second nanolayer of crystalline silicon metamaterial interface, wherein said at least one layer of said amorphized silicon material is interposed between said first and second nanolayers of crystalline silicon metamaterial.

3. A photovoltaic device according to claim 1, wherein said at least one layer of amorphized silicon material, comprising said plurality of substantially separate amorphized silicon regions, comprises a plurality of layers of amorphized silicon material wherein each one of said plurality of layers of amorphized silicon material comprises a plurality of amorphized silicon regions.

4. A photovoltaic device as set forth in claim 3, wherein:
   each one of said plurality of layers of amorphized silicon material are disposed substantially parallel to one another.

5. A photovoltaic device as set forth in claim 4, wherein:
   said plurality of amorphized silicon regions define crest and trough portions.

6. A photovoltaic device as set forth in claim 5, wherein:
   said plurality of crest and trough portions of at least one of said plurality of layers of amorphized silicon material are vertically misaligned with respect to said plurality of crest and trough portions defined within another one of said plurality of layers of amorphized silicon material.

7. A photovoltaic device as set forth in claim 6, wherein:
   said plurality of layers of amorphized silicon material comprises three layers of amorphized silicon material disposed parallel to one another; and
   said plurality of crest and trough portions of a middle one of said three layers of amorphized silicon material is vertically misaligned with respect to said plurality of crest and trough portions defined within the other two of said three layers of amorphized silicon material.

8. A photovoltaic device according to claim 5, wherein said plurality of crest and trough portions of each one of said plurality of layers of amorphized silicon material are respectively vertically aligned with said plurality of crest and trough portions defined within all other ones of said plurality of layers of amorphized silicon material.

9. A photovoltaic device according to claim 1 characterized in that each one of said plurality of substantially separate amorphized silicon regions has a substantially spherical configuration.

10. A photovoltaic device according to claim 1 characterized in that said at least one pair of nanolayers of crystalline silicon metamaterial comprise doped crystalline silicon.

11. A photovoltaic device as set forth in claim 1, wherein:
    each one of said plurality of substantially separate amorphized silicon regions has a substantially hexagonal configuration.

12. A method of making a photovoltaic device, comprising the steps of:
    providing a crystalline silicon base member;
    operatively connecting a rear electrode to said crystalline silicon base member;
    providing a crystalline silicon emitter member formed from a crystalline silicon mass and having a front face;
    operatively connecting a front grid electrode to said front face of said crystalline silicon emitter member;
    forming a PN junction between said crystalline silicon base member and said crystalline silicon emitter member;
    forming at least one continuous layer of amorphized silicon material comprising a plurality of substantially separate amorphized silicon regions by an ion implantation or electron beam irradiation amorphization process and disposed within said crystalline silicon mass of said crystalline silicon emitter member; and
    forming at least one pair of nanolayers of crystalline silicon metamaterial, wherein each one of said at least one pair of nanolayers of crystalline silicon metamaterial has an undulating configuration comprising a plurality of trough and crest portions wherein said plurality of trough portions of a first nanolayer of said at least one pair of nanolayers are respectively disposed opposite said plurality of crest portions of a second nanolayer of said at least one pair of nanolayers such that said plurality of trough portions and said plurality of crest portions of said at least one pair of nanolayers substantially surround said plurality of substantially separate amorphized silicon regions so as to separate said at least one layer of amorphized silicon material from said crystalline silicon mass.

13. The method as set forth in claim 12, wherein:
said formations of said first and second nanolayers of metamaterial are performed by scanning said emitter member with an ion beam or an electron beam.

14. The method as set forth in claim 13, wherein:
said scanning of said emitter member with said ion beam or electron beam is accomplished in accordance with a scanning pattern comprising a lengthwise passage pattern.

15. The method as set forth in claim 12, wherein
said first nanolayer of crystalline silicon metamaterial is interposed between crystalline silicon emitter member and said plurality of substantially separate amorphized silicon regions so as to form a first nanolayer of crystalline silicon metamaterial interface; and
said second nanolayer of crystalline silicon metamaterial is interposed between said crystalline silicon emitter member and said plurality of substantially separate amorphized silicon regions so as to form a second nanolayer of crystalline silicon metamaterial interface, wherein said at least one layer of said amorphized silicon material is interposed between said first and second nanolayers of crystalline silicon metamaterial.

16. The method as set forth in claim 12, further comprising the step of:
subjecting said at least one pair of nanolayers of metamaterial, formed from said crystalline silicon by said ion implantation or electron beam irradiation, to post implantation or irradiation thermal treatment.

17. The method according to claim 12 characterized in that ions used for said ion implantation process step are silicon or phosphorous ions.

18. The method according to claim 17 characterized in that the ion implantation energy ranges from 10 to 300 keV and the dose of ions is between $5\times10^{14}$ cm$^{-2}$ and $5\times10^{16}$ cm$^{-2}$.

19. The method according to claim 12 characterized in that the energy of the electron beam ranges from 200 keV to 5 MeV.

20. The method according to claim 12, further comprising the step of:
subjecting said emitter member to thermal treatment which comprises one initial continuous annealing step followed by at least one cycle of successive discontinuous annealing sequences.

21. The method according to claim 20 characterized in that said at least one cycle of successive discontinuous annealing sequences is performed within a temperature range of 100° C. to 500° C.

22. The method according to claim 21 characterized in that each exposure of said emitter member to said annealing sequence at 500° C. lasts from 2 to 5 minutes with a recuperation time of 1 to 4 minutes wherein said at least one cycle of successive discontinuous annealing sequences comprises three to six cycles.

23. The method according to claim 13 characterized in that said scanning of said emitter member with said ion beam or electron beam is accomplished in accordance with a scanning pattern comprising a crossed passage pattern.

24. The method according to claim 23 characterized in that said crossed passage pattern is an oblique passage pattern.

25. A photovoltaic device, comprising:
a crystalline silicon base member;
a rear electrode operatively connected to said crystalline silicon base member;
a crystalline silicon emitter member formed from a crystalline silicon mass and having a front face;
a front grid electrode operatively connected to said front face of said crystalline silicon emitter member;
a PN junction between said crystalline silicon base member and said crystalline silicon emitter member;
at least one discontinuous layer of amorphized silicon material comprising a plurality of separate amorphized silicon regions and disposed within said crystalline silicon mass of said crystalline silicon emitter member; and
a plurality of nanolayers of crystalline silicon metamaterial respectively entirely surrounding said plurality of separate amorphized silicon regions on all sides so as to separate and isolate said plurality of separate amorphized silicon regions from each other and from said crystalline silicon mass of said crystalline silicon emitter member.

26. A photovoltaic device as set forth in claim 25, wherein:
each one of said plurality of separate amorphized silicon regions has a substantially hexagonal configuration.

27. A photovoltaic device as set forth in claim 25, wherein:
each one of said plurality of separated amorphized silicon regions has a substantially spherical configuration.

28. A method of making a photovoltaic device, comprising the steps of:
providing a crystalline silicon base member;
operatively connecting a rear electrode to said crystalline silicon base member;
providing a crystalline silicon emitter member formed from a crystalline silicon mass and having a front face;
operatively connecting a front grid electrode to said front face of said crystalline silicon emitter member;
forming a PN junction between said crystalline silicon base member and said crystalline silicon emitter member;
forming at least one discontinuous layer of amorphized silicon material comprising a plurality of separate amorphized silicon regions disposed within said crystalline silicon mass of said crystalline silicon emitter member; and
forming a plurality of nanolayers of crystalline silicon metamaterial respectively entirely surrounding said plurality of separate amorphized silicon regions on all sides so as to separate and isolate said plurality of separate amorphized silicon regions from each other and from said crystalline silicon mass of said crystalline silicon emitter member.

29. The method as set forth in claim 28, wherein:
each one of said plurality of separate amorphized silicon regions has a substantially hexagonal configuration.

30. The method as set forth in claim 28, wherein:
each one of said plurality of separate amorphized silicon regions has a substantially spherical configuration.

* * * * *